United States Patent [19]

Belisomi

[11] 4,317,226

[45] Feb. 23, 1982

[54] CIRCUIT ARRANGEMENT FOR TUNING INTO ONE OF A NUMBER OF RADIOELECTRIC SIGNALS

[75] Inventor: Pietro Belisomi, Pinerolo, Italy

[73] Assignee: Indesit Industria Elettrodomestici Italiana S.p.A., Turin, Italy

[21] Appl. No.: 164,849

[22] Filed: Jun. 30, 1980

[30] Foreign Application Priority Data

Jul. 2, 1979 [IT] Italy ............................. 68393 A/79

[51] Int. Cl.³ ............................................ H04B 1/26
[52] U.S. Cl. .................................. 455/174; 455/183; 455/194
[58] Field of Search ............... 455/165, 174, 183, 185, 455/186, 194

[56] References Cited

U.S. PATENT DOCUMENTS 4,228,542  10/1980  Misawa et al. ..................... 455/194
4,247,952  1/1981  Shibuya ............................. 455/194

FOREIGN PATENT DOCUMENTS 2648882  5/1978  Fed. Rep. of Germany .
54-113203  9/1979  Japan ................................. 455/165

OTHER PUBLICATIONS

Leonard Feldman, "Sherwood Model Micro/CPU 100 Stereo FM Tuner", in magazine AUDIO, vol. 61, No. 11, Nov. 1977, pp. 70, 72, 73, 78 & 79.

*Primary Examiner*—Marc E. Bookbinder
*Attorney, Agent, or Firm*—Frost & Jacobs

[57] ABSTRACT

A circuit arrangement for tuning into one of a number of radioelectric signals receivable on a signal receiver, comprising a controllable oscillator the frequency of which is determined by a control loop depending on a digital number N from a processing unit, in turn, dependent on coded input data. The loop comprises a frequency divider for obtaining a first signal from the controllable oscillator depending at least on the number N and a comparitor for comparing the first signal with a second frequency reference signal so as to obtain a third signal for required tuning. The circuit arrangement further prevents signals from being sent to the receiver loudspeaker for a preset length of time if the variation in the number N is over a preset threshold within a preset time interval.

10 Claims, 6 Drawing Figures

CIRCUIT ARRANGEMENT FOR TUNING INTO ONE OF A NUMBER OF RADIOELECTRIC SIGNALS

BACKGROUND OF THE INVENTION

The present invention relates to a circuit arrangement for tuning into one of a number of radioelectric signals receivable on a signal receiver, in particular, a radio receiver, and comprises a controllable oscillator the frequency of which is determined by a control loop depending on a digital number, N, coming from a processing unit, in turn, dependent on coded input data; the said loop in particular comprises frequency dividing means for obtaining from the controllable oscillator to a first signal dependent at least on the said number N and means for comparing the said first signal with a second frequency reference signal so as to obtain a third signal suitable for required tuning.

Circuit arrangements of this type are known to be used on radio receivers and provide for considerable improvement of receiver characteristics as compared with known non-frequency-synthesizer types especially as regards tuning accuracy and stability. These characteristics are particularly important when radio receivers are tuned for frequency modulation reception on the 87–108 MHz frequency band on which a large number of radioelectric signals can be received. Moreover, in these circuit arrangements have been provided circuits which, during the tuning, block the output signal to avoid disturbance signals to the loudspeaker, but they have the disadvantage of being activated in the presence of a generic change of tuning, and do not operate as a function of the particular type of tuning chosen by the user.

SUMMARY OF THE INVENTION

The aim of the present invention is to provide a circuit arrangement of the type mentioned which is versatile as regards operation, in particular during the tuning, comprises easy-to-use tuning control means and is relatively simple to make.

With these aims in view, the present invention relates to a circuit arrangement for tuning into one of a number of radioelectric signals receivable on a signal receiver, comprising a controllable oscillator the frequency of which is determined by a control loop depending on a digital number, N, coming from a processing unit, in turn, dependent on coded input data; the said loop comprising frequency dividing means for obtaining a first signal from the controllable oscillator dependent at least on the said number N and means for comparing the said first signal with a second frequency reference signal so as to obtain a third signal for required tuning, characterised by the fact that it comprises means for preventing signals from being sent to a loudspeaker on the set for a preset length of time if the variation in the said number N is over a preset threshold within a preset time interval.

BRIEF DESCRIPTION OF THE DRAWINGS

The invention will now be described with reference to the attached drawings, provided by way of a non-limiting example in which.

DETAILED DESCRIPTION OF THE INVENTION

Figure 1:
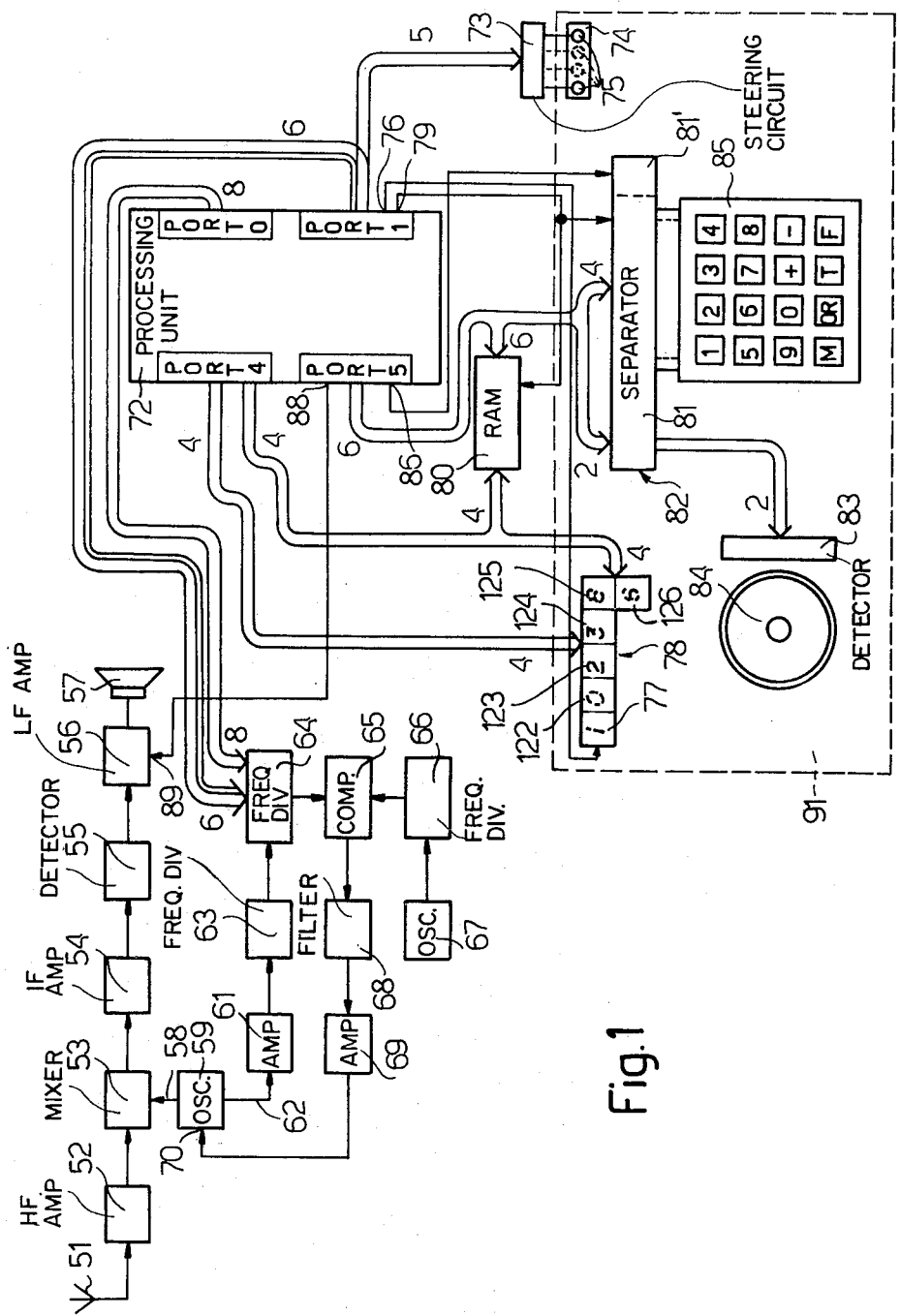
FIG. 1 shows the block diagram of a radio receiver with the circuit arrangement covered by the present invention.

As shown in FIG. 1, a receiving aerial 51 is connected in the known way to a series assembly comprising: high-frequency amplifier 52, mixer 53, intermediate-frequency amplifier 54 (preferably 10.7 MHz), detector 55, low-frequency amplifier 56 and loudspeaker 57. Mixer 53 is supplied, in the known way, with signal 58 from controllable oscillator 59, the signal frequency being adjusted for required tuning as described later on. Controllable oscillator 59 forms part of a phase-control loop circuit of the known type comprising an amplifier, 61, which amplifies part of signal 62 picked up from the output of oscillator 59, and the output of which is connected to a first frequency dividing circuit, 63, which divides by a fixed number, K, for example, 32 or 64, and the output of which is connected to the signal input of a second divider, 64, which divides by a variable, programmable, 14-bit number, N. Divider 64 has its output connected to a first input of a phase- and frequency-comparator circuit, 65, the second input of which receives a reference signal, generated by quartz oscillator 67, via a third frequency dividing circuit, 66. The output of comparator 65 is connected, via filter 68 and amplifier 69, to a control input, 70, which controls the voltage of the varactor diodes of oscillator 59 so as to control the frequency of its output signal. The 14 BITS comprising number N divider 64 divides by are supplied from two sets of input-output terminals of processing unit 72 comprising, for example, an F 3870 microprocessor. The eight least significant BITS of number N are supplied from the terminals marked PORT 0 and the six most significant BITS from the terminals marked PORT 1. Of these six BITS from PORT 1, the five most significant are sent to a circuit, 73, for decoding group 74 comprising LED diode indicators 75 as described later on. The PORT 1 terminal group has an output, 76, which controls the display of a first number, 77, on LED diode alphanumerical display 78. Finally, a last terminal, 79, of the PORT 1 group is further connected to the enabling input of a non-volatile, read-write memory RAM, 80, and to the enabling input of part 81 of separator circuit 82 which connects six BITS of a group of output terminals of processing unit 72, marked PORT 5, to two BITS in detector block 83, operated by means of knob 84 as described later, and to four BITS in keyboard 85 which comprises 10 keys numbered 0 to 9, two keys marked + and − and four auxiliary keys marked M, OR, T and F. The said six BITS connected to the PORT 5 terminal group are also connected to address inputs of memory 80. The PORT 5 terminal group also has a terminal, 86, connected to part 81' of separator circuit 82 so as to be connected to keyboard 85 without going through part 81. It also has an output terminal, 88, connected to enabling input 89 of low-frequency amplifier 56. Processing unit 72 also has a fourth group of terminals, marked PORT 4. Four of these are connected to four data inputs of memory 80 and the figure formation control of display 78 and the other four outputs to selection of the other five figures of display 78. Display 78, indicators 75, keyboard 85 and knob 84 are arranged on a control panel, 91, which also comprises other keys, not shown in the diagram, such as the on/off switch, etc.

Figure 2:
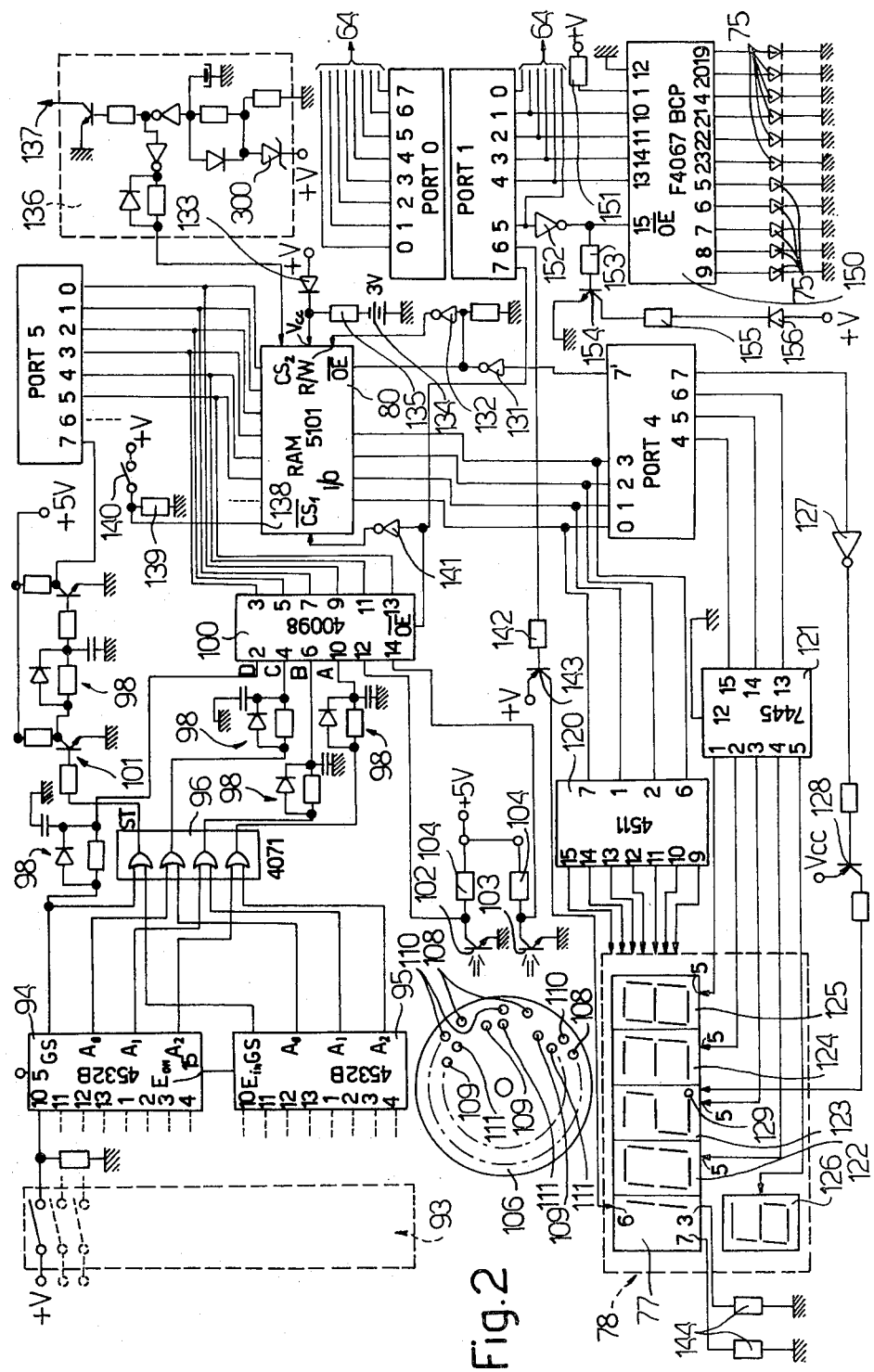
FIG. 2 shows a detailed view of some of the FIG. 1 circuits.

With reference to FIG. 2, number 93 indicates the sixteen keys on keyboard 85 each of which is connected between a +5 V supply terminal and the respective input pin of encoder blocks 94 and 95. These may be 4532 B types and have their outputs connected via OR logic gates on a 4071 integrated circuit, 96, so as to supply, from the sixteen input signals from the sixteen keys of block 93, four output signals, marked A, B, C and D, plus a signal marked ST which is present every time a key is pressed and is used to separate individual key operations, e.g. to show repeat operation of the same key. Networks 98 of known type are arranged on the A, B, C, D and ST signal connections to prevent the formation of signals caused by the keys bouncing. The A, B, C, D signal connections are connected to inputs 10, 6, 4 and 2 respectively of a separator circuit, e.g. 40098, whereas the ST signal is connected to pin 7 of the PORT 5 group via network 101 comprising circuit 98.

Pins 12 and 14 of separator circuit 100 are connected to the collector connections of phototransistors 102 and 103 respectively which have their emitters grounded and the collector connected via resistors to a +5 V supply terminal. The said phototransistors 102 and 103 operate in conjunction with light emitting elements (not shown) on the opposite side of a disc, 106, connected so as to turn with knob 84. The said disc 106 has a first and second set of holes arranged on two circumferences with different diameters. The holes are offset so that a ray of light moving clockwise on the disc encounters, first of all, hole 108 on the outer circumference, then a section of disc, then hole 109 on the inside circumference, another section of disc, then two holes, 110 and 111, belonging to both circumferences and aligned along the same disc radius. This is followed by another sequence of holes 108, 109, 110, 111. Phototransistors 102 and 103 are arranged along the same radius of disc 106, one on the outer and the other on the inner hole circumference respectively.

Separator block 100 has six outputs connected both to six pins marked 0 to 5 on the PORT 5 group and to the first six address pins of RAM memory 80. The latter may be a 5101 type with 256 4-BIT memory cells. Pin 6 of the PORT 5 group is connected to input 89 of amplifier 56 (FIG. 1). Memory 80 has four inputs and outputs connected to four pins 0 . . . 3 of the PORT 4 group which are also connected to four pins of latch decoder 120 which has seven outputs for controlling the lighting of each figure segment of display 78. Block 120 may be a 4511 type. The PORT 4 group has a further 3 pins: 4, 5 and 6 connected to address block 121 for selecting control by latch decoder 120 of figures 122, 123, 124, 125 or 126 of display 78. Block 121 may be a 7445 type. The PORT 4 group also has a first pin, 7, connected, via inverter 127 and the base-collector circuit of transistor 128, to a point indicator element, 129, of figure 123. The PORT 4 group also has another pin, marked 7, connected, via inverter 131, to the output enabling OE input of memory 80 and, via another inverter, 132, to the read-write R/W input of the same memory 80. The latter has a $V_{cc}$ supply input, to which is connected the cathode of diode 133 the anode of which is connected to a +V terminal, and which is also connected to a 3 V battery, 134, via resistor 135. Input CS2 of memory 80 is connected to the output of protection circuit 136 which is connected to a +V supply terminal. The other output, 137, supplies the operating voltage to processing unit 72. Memory 80 has second address inputs, 138, grounded via resistors 139 and connected to their respective +V supply terminals via switches 140 so that, when one of switches 140 closes, the corresponding page, that is, group of cells of memory 80 is read or printed. Input CS1 of memory 80 is connected, via inverter 141, to output 7 of the PORT 1 group which is also connected to the enabling OE input of separator block 100. The said PORT 1 group has a pin, 6, connected via resistor 142 and the base-collector circuit of transistor 143 (the emitter is connected to a +V supply terminal) so as to activate number 77 of display 78. Number 77 has two pins grounded via two resistors 144. The PORT 1 group also has four pins 1 . . . 5 connected to the respective input pins 10 . . . 15 of a decoder 150 which may be an F4067 BCP type. This has eleven outputs connected to the anodes of the respective LED diodes comprising elements 75 the cathodes of which are grounded. Decoder 150 has pin 12 grounded, pin 1 connected to a +V supply terminal, via resistor 151, and pin 15, the output enabling OE pin, connected to pin 5 of the PORT 1 group, via inverter 152 and also, via resistor 153, to the base of NPN transistor 154. The emitter of the latter is grounded and the collector connected, via resistor 155, to the cathode of diode 156 the anode of which is connected to a +V supply terminal. Pins 0 to 5 of the PORT 1 group are therefore connected to divider 64 for forming the six most significant figures of number N while the remaining eight figures of number N are formed by the connection of pins 0 to 7 of the PORT 0 group. For both PORT 0 and PORT 1 groups, the most significant figures go from pins 0 to pins 7.

The circuit shown in FIGS. 1 and 2 of the present invention operates as follows.

Circuits 61, 63, 64, 65, 68 and 69, together with controlled oscillator 69, form a phase lock loop controlled by the reference signal generated by oscillator 67 and divided in the known way by divider circuit 66. The function of divider circuit 63 is to reduce the frequencies involved to more easily processed values whereas programmable divider 64 enables phase locking to be achieved at different frequencies of local oscillator 59 so as to form a frequency synthesizer circuit. The radio receiver must be capable of tuning into stations in the 87–108 MHz frequency range. As the intermediate frequency of amplifier 54 is 10.7 MHz, local oscillator 59 must be capable of generating frequencies ranging from 97.70 to 118.70 MHz. The frequencies produced by oscillator 67 and the values of fixed dividers 63 and 66 are such that, whenever a one-unit change is made to the number N sent to programmable divider 64, the frequency produced by oscillator 59 varies by 0.01 MHz.

This means two types of tuning operation can be performed on keyboard 85 plus a tuning correction and memorisation of 10 preferred stations. Tuning corrections can also be made using knob 84.

Processing unit 72 usually performs a main reading programme of keyboard 85 to detect the presence and type of input data. Whenever one of the F, T, OR, M, + or − keys is pressed, the corresponding coded input data is sent to processing unit 72 which causes a special subroutine to be performed for processing any data entered by the ten number keys or knob 84.

Key F provides for direct frequency selection of a receivable radio signal. This frequency, ranging from 87.00 to 108.00 MHz, is set by pressing the number keys on keyboard 85 so that the corresponding signals A, B, C and D are sent to the PORT 5 group inputs via separator 100 (FIGS. 1 and 2). Indication of the selected frequency is sent by the PORT 4 group to display 78, in particular, to figures 122, 123, 124 and 125. Selection of a particular figure is controlled by block 121 whereas the value of each particular figure is connected by latch decoder 120. The indication at figure 77, which can only be 1 or 0, is supplied from pin 6 of the PORT 1 group. In the example in FIG. 2, display 78 shows a frequency selection of 102.38 MHz. To inform the user that a selection can be accepted, processing unit 72 operates so that numbers 77, 122, 123, 124 and 125 flash on 0 until one of the numbers is selected. Processing unit 72 also checks that the selected frequency is within the receiving range of the set, then calculates number N for the required tuning operation which it sends to programmable divider 74 via 6 BITS from the PORT 1 group and 8 BITS from the PORT 0 group. As already stated, the value of number N is such as to produce a selected frequency plus 10.7 MHz for signal 58 of controllable oscillator 59. Correspondingly, a signal is sent from the PORT 5 group for about 0.2 seconds to input 89 of amplifier 56 so as to disable the amplifier and prevent transient tuning with a noise signal and ensure that loudspeaker 57 only receives the selected station already tuned into. Processing unit 72 also checks that the selected frequency has not already been stored in memory 80. If it has, it indicates, by means of display 78 number 126, which cell of memory 80 the selected frequency has been stored in so as to prevent duplicate storage.

Selection of a given frequency in this way can be altered either by pressing the + or − keys on keyboard 85, which varies frequency by + or −0.01 MHz, or by turning knob 84. Turning knob 84 rotates disc 106 so that hole groups 108, 109, 110 and 111 pass in front of phototransistors 102 and 103 which supply digital signals with 1 or 0 logic levels which are sent to the PORT 5 group inputs. When disc 106 rotates, for example, counterclockwise, hole 108 passes first in front of phototransistor 102 which emits a logic signal corresponding to decimal number 1; next, hole 109 passes in front of phototransistor 103 which emits a logic signal corresponding to decimal number 2; lastly, holes 110 and 111 pass in front of phototransistors 102 and 103 which emit logic signals corresponding to decimal number 3. The numbers supplied by disc 106 are separated by decimal 0 numbers. By processing these logic signals from phototransistors 102 and 103, processing unit 72 calculates which way knob 84 has been turned and then increases or decreases number N of divider 64 and the frequency tuned into accordingly. It also calculates the speed of rotation of knob 84 so that the increase or decrease in selected frequency varies in steps of 0.01 MHz or ten times greater, that is, 0.1 MHz. In the latter case, processing unit 72 disables amplifier 56 for 0.2 seconds. In all the above cases of tuning alteration, processing unit 72 checks the newly selected frequencies have not already been stored in memory 80. As the tuned frequency is changed, the new value is always sent to display 78. The five most significant BITS of the N number sent to divider 64 and indicating the value of the tuned frequency are also sent to block 150 which, depending on the said number, supplies, via the +V terminal, resistor 151 and one of the LED diodes 75 which provide a visual indication of the position of the selected frequency in the receivable frequency range, that is, 87–108 MHz. Turning on diode 156, which corresponds to a frequency selection in the lower range, from 87 to 90 MHz, is controlled directly by transistor 154 instead of decoder 150 which, in this condition is disabled.

If a tuned frequency is to be stored in memory 80, key M is pressed, which provides for storage, followed by one of the number keys corresponding to the memory 80 cell in which the tuned frequency is to be stored.

Calling up a stored frequency is done in indirect selection mode by pressing one of the number keys corresponding to the memory 80 cell the stored station is to be called up from. Cell address selections to memory 80 are supplied to the memory by the PORT 5 group while data is exchanged between processing unit 72 and memory 80 via the PORT 4 group. The frequency called up from memory 80 is sent to display 78 and processing unit 72 determine disabling of amplifier 56 for 0.2 seconds. Any alteration in tuning, and consequently in the receivable frequency, is made using the + or − keys or by turning knob 84 as already described for direct selection mode.

Pressing the OR key on keyboard 85 displays the time (numbers 122, 123, 124 and 125 of display 78) expressed in hours and minutes. This time indication can be set initially, for processing unit 72, by pressing the OR key twice in succession.

The time indication by display 78 and, consequently, constant for processing unit 72 to receive frequency selection indications from keyboard 85 and knob 84, can be turned off by pressing key T which sets processing unit 72 to indirect selection mode as already described.

The following is a detailed description of the various operating modes of one of the possible applications of the present circuit arrangement, using a microprocessor and with reference to the block diagrams of FIG. 3-6 showing the elementary logic functions performed.

Figure 3:
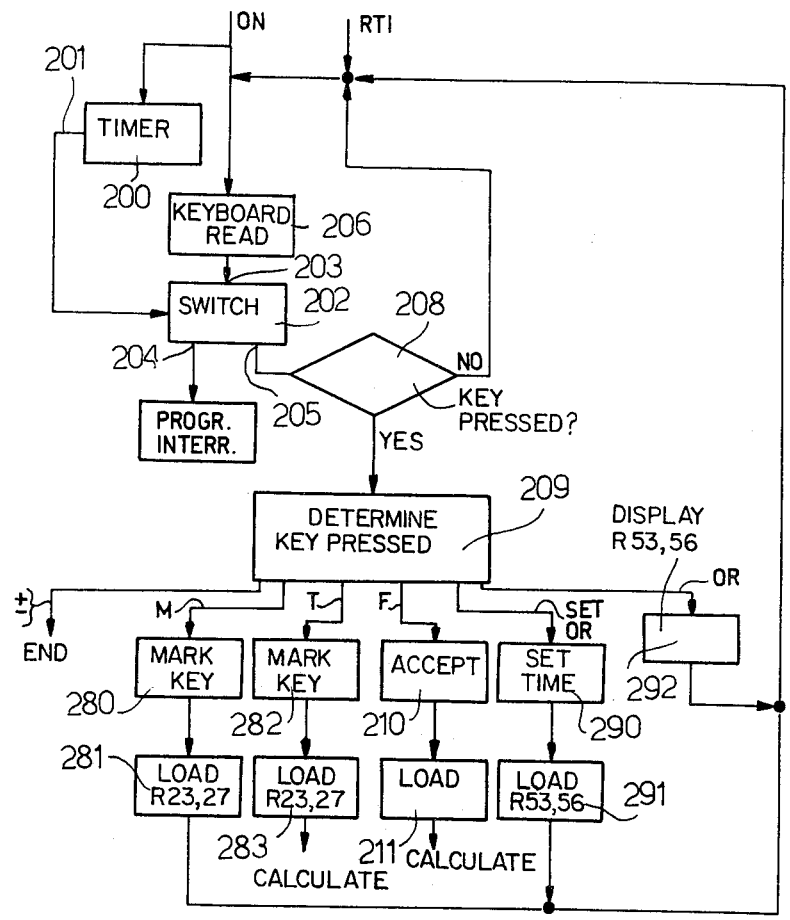
FIGS. 3, 4, 5 and 6 show block diagrams of the logic functions performed by the circuits in the present arrangement.

FIG. 3 shows one way of operating the initial logic functions when the set is turned on and controlling selection and performance of the aforesaid operating modes.

Figure 4:
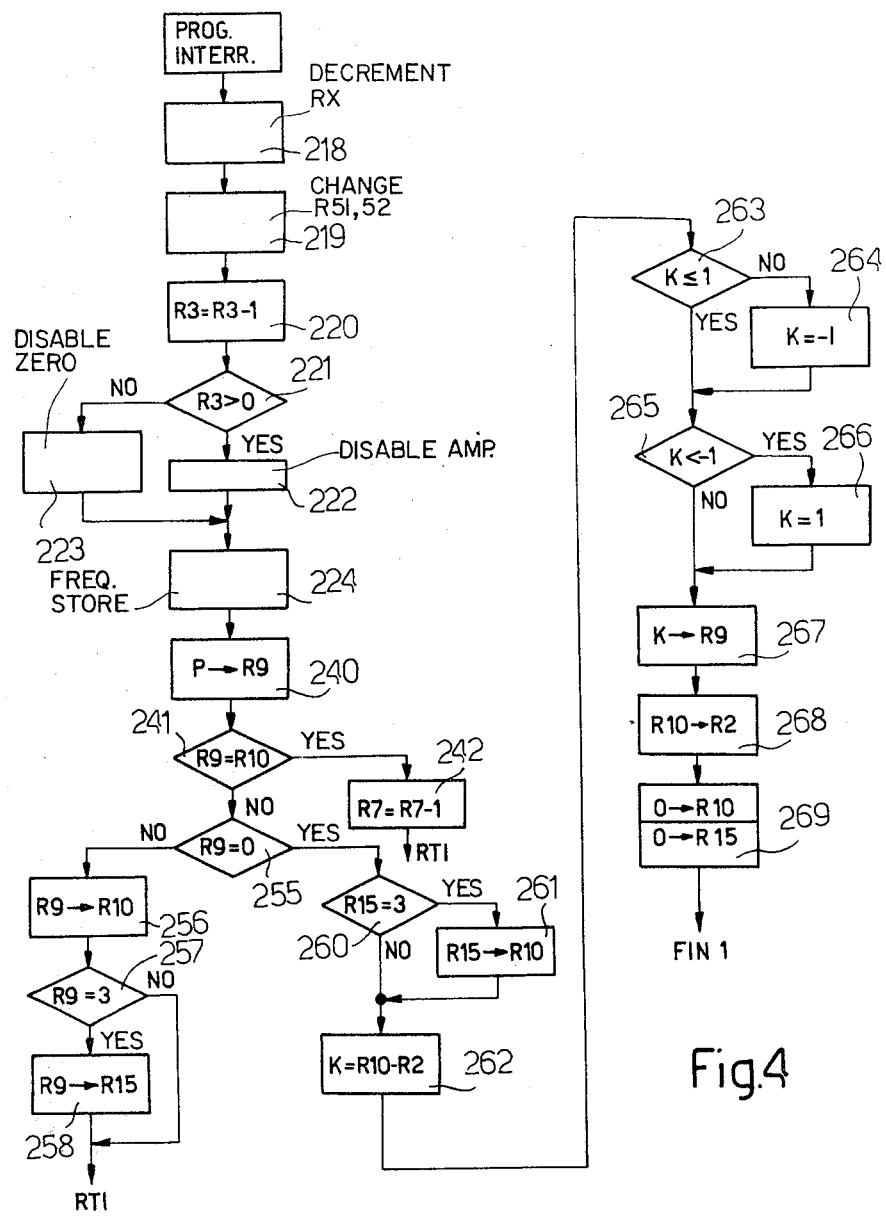
Figure 5:
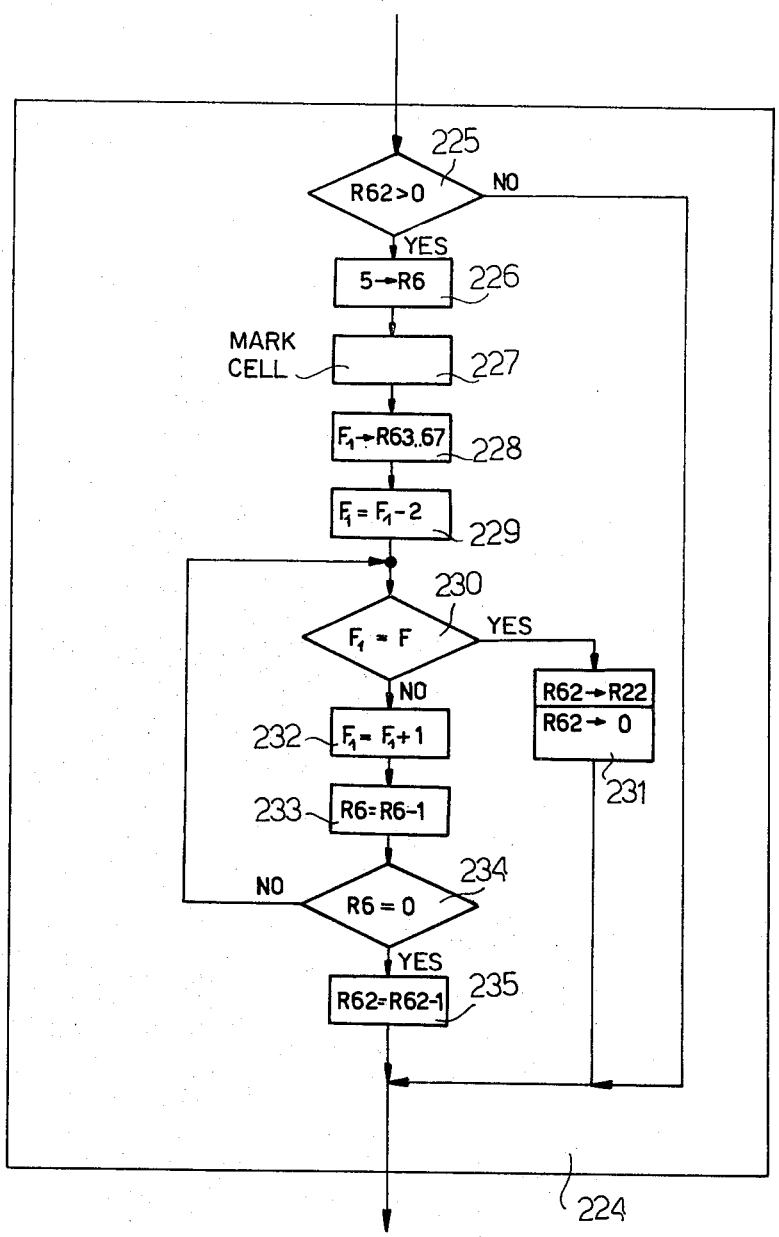
Figure 6:
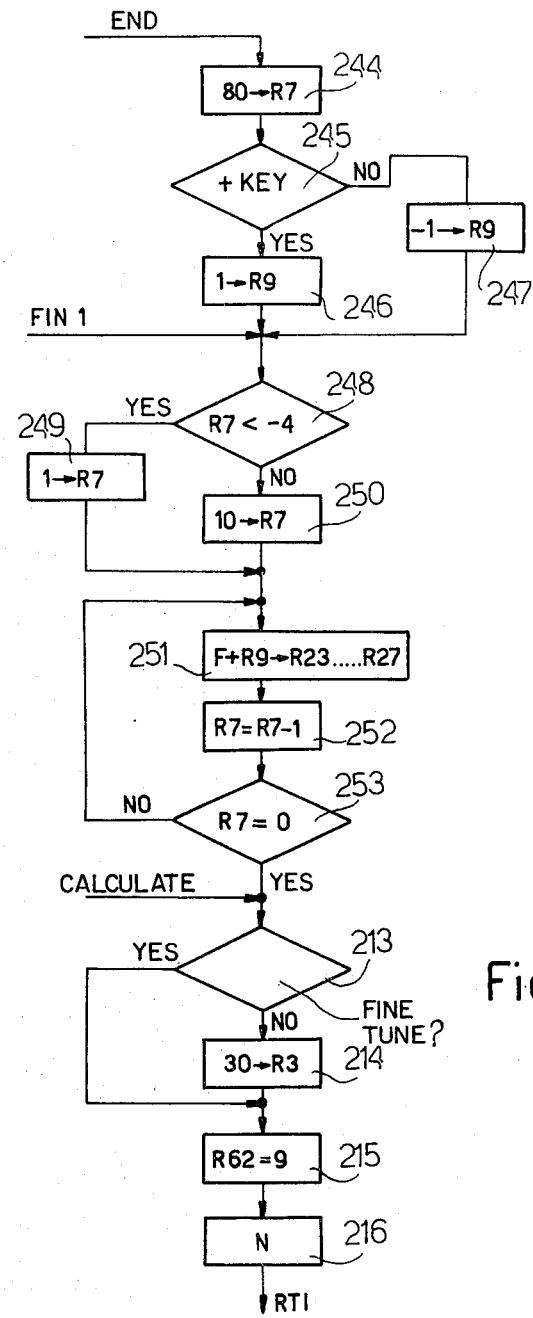

When the set is turned on, an ON signal is supplied to start timer 200 which supplies output signal 201 for controlling block 202 comprising a switch circuit with one input, 203, and two outputs, 204 and 205. The ON signal is also supplied to block 206 for reading keyboard 85 and storing the pressed keys. The output of block 206 is connected to input 203 of switch circuit 202. Output 204 of block 202 is connected to an interrupt program which will be described in more detail with reference to FIG. 4, while output 205 is connected to block 208 which checks whether a key on keyboard 85 has been pressed. If it has not, there is a return to the input of keyboard reading block 206; if it has, block 209 is activated to ascertain which key has been pressed. Timer block 200 supplies signal 201 periodically every 4 m sec. Consequently, block 202 normally connects input 203 to output 205 and block 206 continues reading keyboard 85 until a key is pressed which is detected by block 208. Every 4 m sec, input 203 of block 202 is connected to output 204 so that the interrupt program is performed regardless of whether a key has been pressed or not on keyboard 85. (Continuing our examination of the main program, let us imagine key F has been pressed. In this case, block 209 emits an F signal which is sent to block 210 which controls acceptance of the selected frequency number keys pressed on keyboard 85. As already mentioned, processing unit 72 checks whether the frequency falls within the receivable frequency range. This brings us to block 211 which loads the selected numbers into five registers (R23 . . . 27) and controls their display on display 78. Next, a control signal is supplied for calculating the N number to be sent to divider 64 which brings us to the diagram shown in FIG. 6, more precisely, to block 213 which analyses whether there has already been a fine tuning condition, that is, whether the + or − key has been pressed or knob 84 turned slowly, as we shall see later, below a preset threshold. If the response is negative, as in the case we are examining, this brings us to block 214 which loads a hexadecimal value of 30 into register R3 the function of which, as we shall see with reference to FIG. 4, is to disable amplifier 56 for 0.2 seconds. The output of block 214, like the positive output of block 213, brings us to block 215 which loads a value of 9 into register R62 the function of which, as we shall see with reference to FIG. 5, is to check whether the selected frequency has not already been stored in memory 80. This brings us to block 216 which calculates the 14-BIT binary number N to be sent to divider 64 and controls sending of the same via eight PORT 0 and six PORT 1 group outputs. As already mentioned, the five most significant numbers of the latter turn on one of LED diodes 75 which provide a visual indication of the position of the selected frequency in the receivable frequency range. The N number sent to divider 64 is such as to determine a frequency equal to the selected frequency plus 10.7 MHz for signal 58 of oscillator 59 for tuning into the required signal. From block 216, a signal, RT1, is sent out which returns to the input of keyboard reading block 206 so as to be ready for receiving new control signals. Meanwhile, as already mentioned, the interrupt program is performed every 4 m sec. With reference to FIG. 4, after operating on blocks 218 and 219, which will be described later on, it decreases the content of register R3 by one unit, via block 220, then passes on to block 221 which analyzes whether the content of register R3 is greater than 0. It it is, it passes on to block 222 which generates signal 88 from the PORT 5 group of processing unit 72 for disabling amplifier 56. If it is not, it is sent to block 223 which zeroes the disabling signal of amplifier 56. As 48 has been loaded into register R3 via block 214, the content of register R3 only returns to 0 and amplifier 56 is only enabled to operate via block 223 after 48 interrupt programs have been performed, that is, after 48×4=192 m sec.

Both block 222 and 223 bring us to block 224 which checks whether the tuned frequency has already been stored or not. With reference to FIG. 5, we arrive at block 225 which checks whether the content of register R62 is greater than 0. If it is, as in this case where block 215 loaded 9 into register R62, we arrive at block 226 which loads 5 into register R6. A following block, 227, marks the memory 80 cell corresponding to the R62 register number and the next block, 228, enters the five data (indicated by F1) relative to the marked cell into registers R63 to R67. The next block, 229, takes as the new F1 value the previous value minus 2 while the next block, 230, compares whether the new F1 value is equal to or less than the selected frequency F value loaded into registers R23 to R27. If it is, we arrive at block 231 which loads the R62 register value into register R22 and sends the number to figure 126 of display 78. Block 224 is then left with the frequency already stored. If it is not, we arrive at block 232 which imposes as the new F1 value the previous value plus 1. This brings us to block 233 which reduces the content of register R6 by one unit. This brings us to block 234 which checks whether the content of register R6 is equal to 0. If it is not, there is a return to the input of block 230. If it is, we pass on to block 235 which reduces the content of register R62 by one unit after which block 224 is left. In this way, by means of the control loop comprising blocks 230, 232, 233 and 234, a check is made as to whether the selected frequency is equal to or less than the frequency stored in each cell of memory 80 plus or minus 0.02 MHz. If it is, the number of the memory 80 cell in which the said frequency + or −0.02 MHz is stored is sent to FIG. 126 of display 78 via block 231. In this condition, when register R62 is zeroed, block 225 finds R62 equal to 0 when the next interrupt program is performed and, as no control is needed of memory 80, this brings us directly to the output of block 224. Block 224 operates as described for each interrupt program, that is, every 4 m sec, and each time a single cell check is made of memory 80 to ascertain whether the selected frequency has already been stored. Control of a new cell during the next interrupt program is determined by a reduction of register R62 controlled by block 235. Control of the ten cells of memory 80 therefore takes 10×4=40 m sec.

With reference to FIG. 4, block 224 brings us to block 240 which takes as a binary number the combination of logic signals supplied by phototransistors 102 and 103, described previously, and loads it into register R9. This brings us to block 241 which checks whether the content of register R9 is equal to that of register R10 relative to the binary number previously determined by the position of knob 84. If it is the same, showing that knob 84 has not been moved, we arrive at block 242 which reduces the content of register R7 and we return with signal RT1 to the input of keyboard reading block 206. If no new keys are pressed and knob 84 is not moved, the interrupt program is repeated every 4 m sec for the part described in which, as we have already mentioned, the content of register R3 is reduced, via block 220, to 0 so as to enable amplifier 56 after about 0.2 seconds and a check is then made of the memory 80 cells via block 224. Furthermore, block 242 reduces the content of register R7 to a minimum of 7F (hexadecimal).

Tuning alterations can be made either by pressing the + or − keys or turning knob 84. The former operation is detected by blocks 206, 208 and 209 of FIG. 3 the latter of which generates a END signal which is sent to block 244 (FIG. 6) which loads a value of 80 (hexadecimal) into register R7. This brings us to block 245 which checks whether the + key has been pressed. If it has, we arrive at block 246 which loads a value of 1 into register R9. If it has not, we arrive at block 246 which loads a value of −1 into register R9. From block 247 or 247 which, depending on whether the + or − key has been pressed, load a value of +1 or −1 into register R9 for increasing or decreasing the tuned frequency by one step, that is, 0.01 MHz, we arrive at block 248 which checks whether the content of register R7 is less than −4. The function of block 248 is to analyze whether a fast or slow tuning alteration is being performed the borderline between the two conditions being established at −4. As, in this operation mode, register R7 has been loaded, via block 244, with a value of 80, which is less than −4, we arrive at block 249 which loads a value of 1 into register R7. In the event of a fast turning alternation being made, which will be analyzed later on, we arrive at block 250 which loads a value of 10 into register R7. In the present case of the + or − key being pressed, block 249 brings us to block 251 which calculates as the new frequency value the previous F value contained in registers R23 to R27 plus the value of register R9 (+1 or −1), loads it into registers R23 ... R27 and displays their content on display 78. This brings us to block 252, which reduces the value of register R7, and block 253 which analyzes whether R7 is equal to 0. If it is, as in this case in which block 249 has loaded a value of 1 into register R7, we arrive at block 213 which, recognising the previous END signal or slow tuning alteration condition, skips block 214 and goes directly to block 215. Register R62 is therefore loaded with a value of 9 which brings us to block 216 which calculates the new N number to be sent to divider 64 for tuning into the new frequency. This brings us back once more to the input of block 206 and every 4 m sec the interrupt program is repeated during which a check is made, as already described, via block 224, to ascertain whether the new frequency has already been stored or not. If knob 84 is left untouched, block 241 brings us to block 242 which reduces the content of register R7 down to a minimum of 7F.

For tuning alterations using knob 84, the new datum P supplied by phototransistors 102 and 103 is altered and detected by block 241 (FIG. 4). This brings us to block 255 which checks whether the content of register R9 is equal to 0. If it is not, we arrive at block 256, which loads the content of register R9 into register R10, and block 257 which checks whether the content of register R9 is equal to 3, that is, corresponding to holes 110 and 111 passing in front of phototransistors 102 and 103. If it is, the content of register R9 is loaded, via block 258, into register R15 and there is a return to the main program. If it is not, the main program is returned to directly. Via block 256, therefore, register R10 is loaded with the position of knob 84, corresponding to hole 108, 109 or 110 and 111 passing in front of phototransistors 102 or 103, and register R15 with the passage of holes 110 and 111, via block 258. The direction and speed of rotation of knob 84 are calculated over the next rotation during which hole 108 or 109 or 110 and 111 are no longer aligned with phototransistors 102 and 103 and R9 is equal to 0. Block 241 brings us to block 255 and from there to block 260 which checks whether the content of register R15 is equal to 3. If it is, we arrive at block 261, which loads the content of register R15 into register R10, and block 262 which calculates value K as the difference between the contents of registers R10 and R2 (the latter being, as we shall see later, the value of the previous reading). If, on the other hand, R15 is not equal to 3, block 260 brings us directly to block 262 which brings us to block 263 which checks whether K is less than or equal to 1. If it is not, we arrive at block 264, which equals K to −1, then to block 265 which is also arrived at directly from block, 263 if K is found to be less than or equal to 1. Block 265 checks whether K is less than −1. If it is, from block 265 we arrive at block 266, which equals K to 1, and then to block 267 which is also arrived at directly from block 265 if K is not found to be less than −1. Block 267 loads value K into register R9 which brings us to block 268 which loads the value of register R10 into register R2. Finally, we arrive at block 269 which makes the contents of registers R10 and R15 equal to 0. Via block 262, which calculates the difference between the contents of registers R10 and R2, that is, between two successive readings of holes 108 or 109 or 110 and 111 passing in front of phototransistors 102 and 103, we are given value K which depends on knob 84 being turned one way or the other. In one direction of rotation, K may be equal to 2 or −1 and, in the opposite direction, to 1 or −2. In the former case, K is always made to equal −1, via blocks 264 and 265, and, in the latter, to equal +1, via blocks 263 and 266, so that register R9, via block 267, contains a value of +1 or −1 depending on which way knob 84 has been turned for increasing or reducing the tunable frequency respectively. Blocks 260 and 261 provide for rejecting any inaccurate values relative to positions 1 or 2, that is, relative to the passage of holes 108 or 109, in the case of an actual passage of position 3, that is, holes 110 and 111, and a wrong indication caused soley by partial radial misalignment of holes 110 and 111.

From block 269 we arrive at block 248 (FIG. 6) which checks the content of register R7. This depends on how many times block 242 has been activated, that is, on the measurement of time during which the contents of registers R9 and R10, and consequently the knob indication, have been found to be equal by block 241. As the function of block 248 is to check whether R7 is less than −4, if the knob indication varies in less than 16 m sec, this shows we are in fast tuning alteration mode whereas the contrary situation indicates slow tuning alteration mode. As already mentioned, these two conditions are varied by block 248 which, via block 249 or 250, assigns a value of 1 or 10 to register R7 to indicate a slow or fast tuning alteration. By means of block 251, the selected frequency value F is changed with the value of register R9 which, via block 267, has been made equal to +1 or −1 depending on which way knob 84 is turned. The modified value is then loaded into registers R23 to R27 and displayed on display 78. If knob 84 is being turned slowly, in which case block 249 has been activated, we arrive at blocks 252 and 253, then at block 213 and directly at block 215 which activates block 224 during the next interrupt program for checking whether the new frequency has been stored. From here, we move on to block 216 which calculates the new N number to be sent to divider 64. In the event of a fast tuning alteration, on the other hand, in which case block 250 has been activated, the loop comprising blocks 251, 252 and 253 is performed ten times so that the newly tuned frequency value varies by + or −0.1 MHz as compared with the previous value, that is, ten times greater. In this condition, block 253 brings us to block 213 and from there to block 214 which loads a value of 30 into register R3 so that, during the next interrupt program, block 222 is activated for disabling amplifier 56. Block 215 is also activated, as is block 224, which checks whether the new frequency has been stored, and the newly calculated N number is sent from block 216 to divider 64.

The above fast tuning alteration phases can, of course, be performed for each interrupt program if knob 84 is turned continuously at relatively high speed, e.g. roughly one fifth of a turn in half a second, so as to determine continual tuning alterations in 0.1 MHz steps.

Now, let us examine another operating mode. A given tuned frequency can be stored by pressing key M on keyboard 85. This is detected by block 208 and analyzed by block 209 which supplies an M signal to block 280 (FIG. 3) which marks one the the ten cells of memory 80 corresponding to the number key pressed on keyboard 85. A command is then given, via block 281, to load the content of registers R23 to R27, relative to the current tuned frequency, into the selected cell of memory 80. A return is then made to block 206 for detecting whether a new key has been pressed.

A given frequency stored in one of the memory 80 cells can be called up by pressing a number key on keyboard 85.

A signal, T, is then sent out from block 209 to block 282 which marks the memory 80 cell corresponding to the number key that has been pressed. This brings us to block 283 which loads the content of the said cell into registers R23 to R27 and displays the numbers on display 78. Next, we arrive at block 213 (FIG. 6) and from there to blocks 214 and 215 which, during the next interrupt program, disable amplifier 56 temporarily and check the memory via block 224 (in this case, the number of the selected cell is indicated by number 126). This brings us to block 216 which detects the content of registers R23 to R27 and calculates number N which is sent to divider 64. A further alteration of the frequency called up from memory 80 can be made, as already described, using either the + or − keys or knob 84.

Keyboard 85 also has a key marked OR for setting and displaying hours and minutes. Pressing the OR key twice in succession is detected by blocks 206, 208 and 209 and a SET-OR signal supplied to block 290 which accepts the number keys indicating the hours and minutes pressed later by the operator for the initial setting. Via block 291, these figures are loaded into registers R53 to R56 and displayed at FIGS. 122, 123, 124 and 125 of display 78. The indication is turned off by pressing key T which brings the set back to number key acceptance mode for indirect frequency selection and tuning into a frequency stored in a selected cell of memory 80. With reference to FIG. 4, every time the interrupt program is performed, the value of register RX, initially made equal to 250, is decreased by one unit via block 218. The content of register RX is therefore zeroed every 250×4 m sec=1 second and goes to block 219 which alters the content of registers R51 and R52 relative to the seconds indication. When registers R51 and R52 reach 60, they alter the content of registers R53 and R54 relative to the minutes indication. When these also reach 60, they alter the content of registers R55 and R56, relative to the hours indication, which are zeroed when they reach 24. Therefore, to display the current time, that is, the current content of registers R53 to R56 relative to the hours and minutes, the OR key is pressed once. This is picked up by blocks 206, 208 and 209 and an OR signal supplied to block 292 which sends the content of registers R53 ... R56 to display 78. In this case too, the display is turned off by pressing key T. The sequence of elementary operations, that is, the program, to be performed by processing unit 72 is contained in coded form in a read-only (ROM) memory of unit 72 itself. This memory circuit is essentially comprised of a 2048×8 format connection matrix, address input and decoding circuits and output circuits. Each connection may be open or closed and represents a permanent elementary 1 or 0 BIT. Each group of 8 connections, addressed by one of the 2048 address input combinations, represents an elementary 8-BIT instruction or word (byte). By applying all the possible address combinations at the input, all the data contained in work form in the memory can be obtained at the output. The connection matrix can be made, for example, by masking when the integrated circuit is made (ROM) or by fusing a connection (PROM). The advantages of the present invention will be clear from the description given.

In particular, the value of a receivable frequency, tuned into previously from keyboard 85, can be increased or decreased by means of knob 84. Digital signal control by knob 84 is affected relatively simply by photoelectric connection with phototransistors 102 and 103 and insertion of punched disc 106 as already described. By merely altering the rotation speed of knob 84, tuning alterations can be made in steps of 0.01 or 0.1 MHz. The former case enables fine tuning with scanning of the entire receivable frequency range over about forty turns of knob 84 whereas the latter provides for scanning the entire receivable frequency range over as little as four turns of the said knob.

To prevent duplicate storage, display 78 indicates whether a given tuned frequency has already been stored or not in memory 80.

In the event of a frequency jump tuning operation, to prevent noise signals disturbing loudspeaker 57, amplifier 56 is disabled for about 0.2 seconds, that is, until tuning has been completed. Amplifier 56 is disabled for both direct or indirect selection and fast rotation of knob 84 whereas it is not disabled if knob 84 is rotated slowly or if the + or − keys are pressed. LED diodes 75 and diode 156 provide a fairly representative visual indication of where the tuned frequency is placed on the receivable frequency scale.

To those skilled in the art it will be clear that changes can be made to the circuit arrangement described and shown on the drawings without, however, departing from the scope of the present invention. For example, the set may be programmed for tuning into frequencies other than those described in the 87–108 MHz range. The set may also be fitted with a remote control in which case a keyboard similar to the one described is combined with the portable transmitting part of the remote-control system.

What I claim is:

1. A circuit arrangement for tuning into one of a number of radioelectric signals receivable on a signal receiver, comprising a controllable oscillator the frequency of which is determined by a control loop depending on a digital number N from a processing unit, in turn, dependent on coded input data; the loop comprising frequency dividing means for obtaining a first signal from the controllable oscillator dependent at least on the number N and means for comparing said first signal with a second frequency reference signal so as to obtain a third signal for required tuning, characterised by means for preventing signals from being sent to a loudspeaker for a preset length of time if the time rate of change of the number N within a preset time interval exceeds a preset threshold.

2. The circuit arrangement according to claim 1, characterized by the fact that the coded input data is in the form of digital signals from a keyboard and continuously operable manual means, said means for preventing said signals from being sent to the loudspeaker being activated when the time rate of change of the number N within a preset time interval exceeds said preset threshold either by said input data from the keyboard means or said input data from the manually operable means.

3. The circuit arrangement according to claim 2, characterised by the fact that the number N is determined via the keyboard means and that the manually operable means supply digital signals for increasing or decreasing the number N.

4. The circuit arrangement according to claim 3, characterised by the fact that the manually operable means comprise a turnable knob.

5. The circuit arrangement according to claim 2, characterised by the fact that the manually operable means, depending on whether operating speed is over or below a given threshold, determine a first or second variation of the number N, over or below the threshold for said number N.

6. The circuit arrangement according to claim 5, characterised by the fact that, depending on whether the operating speed is over or below the threshold, the variation of the frequency of the number N is ten times greater in the former than in the latter case.

7. The circuit arrangement according to claim 1, including a low frequency amplifier connected between the receiver and the loudspeaker characterised by the fact that said means for preventing said signals from being sent to the loudspeaker operates so as to block the output signal of the low-frequency amplifier.

8. The circuit arrangement according to claim 1, characterised by the fact that said processing unit comprises an F3870 type microprocessor.

9. The circuit arrangement according to claim 1, characterised by the fact that the signal receiver is a radio.

10. The circuit arrangement according to claim 1, characterised by the fact that the tunable radioelectric signals fall essentially within the 87–108 MHz frequency range.

* * * * *